United States Patent
Potocek et al.

(10) Patent No.: US 9,478,393 B2
(45) Date of Patent: Oct. 25, 2016

(54) COMPUTATIONAL SCANNING MICROSCOPY WITH IMPROVED RESOLUTION

(71) Applicant: FEI Company, Hillsboro, OR (US)

(72) Inventors: Pavel Potocek, Eindhoven (NL); Faysal Boughorbel, Eindhoven (NL); Berend Helmerus Lich, Weert (NL); Matthias Langhorst, Hameln (DE)

(73) Assignee: FEI COMPANY, Hillsboro, OR (US)

( * ) Notice: Subject to any disclaimer, the term of this patent is extended or adjusted under 35 U.S.C. 154(b) by 0 days.

(21) Appl. No.: 14/752,570

(22) Filed: Jun. 26, 2015

(65) Prior Publication Data
US 2016/0013015 A1    Jan. 14, 2016

(30) Foreign Application Priority Data
Jun. 30, 2014   (EP) .................................... 14174903

(51) Int. Cl.
| | |
|---|---|
| G01Q 10/06 | (2010.01) |
| H01J 37/244 | (2006.01) |
| G02B 21/00 | (2006.01) |
| H01J 37/285 | (2006.01) |
| H01J 37/28 | (2006.01) |

(52) U.S. Cl.
CPC ........... *H01J 37/244* (2013.01); *G02B 21/008* (2013.01); *H01J 37/28* (2013.01); *H01J 37/285* (2013.01)

(58) Field of Classification Search
USPC ........ 250/306, 307, 309, 310, 311; 850/1, 2, 850/3, 4, 5, 6, 7
See application file for complete search history.

(56) References Cited

U.S. PATENT DOCUMENTS

| | | | |
|---|---|---|---|
| 8,232,523 B2 | 7/2012 | Boughorbel et al. |
| 8,581,189 B2 | 11/2013 | Boughorbel et al. |
| 8,586,921 B2 | 11/2013 | Boughorbel et al. |
| 8,704,176 B2 | 4/2014 | Boughorbel et al. |

(Continued)

OTHER PUBLICATIONS

Roman Schmidt et al., "Spherical Nanosized Focal Spot Unravels the Interior of Cells", Nature Methods, vol. 5, No. 6, Jun. 1, 2008, 6 pages.

(Continued)

*Primary Examiner* — Nicole Ippolito
(74) *Attorney, Agent, or Firm* — Scheinberg & Associates, P.C.; Michael O. Scheinberg

(57) ABSTRACT

A method of imaging a specimen comprises
directing a beam to irradiate a specimen;
detecting radiation emanating from the specimen;
scanning the beam along a path;
for each sample point in said path, recording a measurement set M={(Dn, Pn)}, where Dn is the detector output as a function of value Pn of measurement parameter P;
deconvolving M and spatially resolving it into a set representing depth-resolved imagery of the specimen, whereby, at point pi within the specimen,
in a first probing session, irradiating, in a first beam configuration, pi with Point Spread Function F1, whereby said beam configuration is different to P;
in at least a second probing session, irradiating, in a second beam configuration, pi with Point Spread Function F2 which overlaps partially with F1 in a zone Oi in which pi is located;
sing an Independent Component Analysis algorithm to perform spatial resolution in Oi.

14 Claims, 11 Drawing Sheets

(56) References Cited

U.S. PATENT DOCUMENTS

| | | | |
|---|---|---|---|
| 2004/0054281 A1* | 3/2004 | Adam | A61B 8/587 |
| | | | 600/437 |
| 2009/0141959 A1 | 6/2009 | Can et al. | |
| 2010/0224796 A1* | 9/2010 | Mertz | G02B 21/0056 |
| | | | 250/459.1 |
| 2011/0266440 A1 | 11/2011 | Boughorbel et al. | |
| 2013/0037715 A1* | 2/2013 | Boughorbel | H01J 37/222 |
| | | | 250/307 |
| 2013/0228683 A1* | 9/2013 | Boughorbel | H01J 37/222 |
| | | | 250/307 |

OTHER PUBLICATIONS

Dahman, Tim et al., "Combined Scanning Transmission Electron Microscopy Tilt- and Focal Series," Microscopy and Microanalysis, 2014, pp. 1-13.

Escovitz, W. H. et al., "Scanning Transmission Ion Microscope with a Field Ion Source," Proc. Nat. Acad. Sci. USA, 1975, vol. 72, No. 5, pp. 1826-1828.

Mabrouk, Rostom et al., "Dynamic Cardiac PET Imaging: Extraction of Time-Activity Curves Using ICA and a Generalized Gaussian Distribution Model," IEEE Transactions on Biomedical Engineering, 2013, vol. 60, No. 1, pp. 63-71.

Ramachandra, Ranjan et al., "Optimized Deconvolution for Maximum Axial Resolution in Three-Dimensional Aberration-Corrected Scanning Transmission Electron Microscopy," Microsc Microanal. 2012, vol. 18, No. 1, pp. 218-228.

Yu, Yong et al., A Bayesian 3D Volume Reconstruction for Confocal Micro-rotation Cell Imaging, MICCAI 2007, Part II, LNCS 4792, pp. 685-692.

Unknown, "Confocal microscopy," //en.wikipedia.org/wiki/Confocal_microscopy, accessed Jun. 26, 2015, 9 pages.

Unknown, "Electron microscope," //en.wikipedia.org/wiki/Electron_microscope, accessed Jun. 26, 2015, 10 pages.

Unknown, "Independent component analysis," //en.wikipedia.org/wiki/Independent_component_analysis, accessed Jun. 26, 2015, 12 pages.

Unknown, "Scanning electron microscope," //en.wikipedia.org/wiki/Scanning_electron_microscope, accessed Jun. 26, 2015, 17 pages.

Unknown, "Scanning Helium Ion Microscope," //en.wikipedia.org/wiki/Scanning_Helium_Ion_Microscope, accessed Jun. 26, 2015, 2 pages.

Unknown, "Scanning transmission electron microscopy," //en.wikipedia.org/wiki/Scanning_transmission_electron_microscopy, accessed Jun. 26, 2015, 4 pages.

Unknown, "Transmission electron microscopy," http://en.wikipedia.org/wiki/Transmission_electron_microscopy, accessed Jun. 26, 2015, 21 pages.

Hyvarinen, Aapo, et al., "Independent Component Analysis: Algorithms and Applications," Neural Networks, 2000, vol. 13, No. 4-5, pp. 411-430.

Lanteri, Henri, et al., "Penalized maximum likelihood image restoration with positivity constraints: multiplicative algorithms," Inverse Problems, 2002, vol. 18, pp. 1397-1419.

\* cited by examiner

COMPUTATIONAL SCANNING MICROSCOPY WITH IMPROVED RESOLUTION

The invention relates to a method of accumulating an image of a specimen using a scanning-type microscope, comprising the following steps:

- Directing a beam of radiation from a source through an illuminator so as to irradiate a surface S of the specimen;
- Using a detector to detect a flux of radiation emanating from the specimen in response to said irradiation;
- Causing said beam to follow a scan path relative to said surface;
- For each of a set of sample points in said scan path, recording an output $D_n$ of the detector as a function of a value $P_n$ of a selected measurement parameter P, thus compiling a measurement set $M=\{(D_n, P_n)\}$, where n is a member of an integer sequence;
- Using computer processing apparatus to automatically deconvolve the measurement set M and spatially resolve it so as to produce reconstructed imagery of the specimen.

The invention also relates to a scanning-type microscope in which such a method can be performed.

Charged-particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" tools (e.g. a FIB-SEM), which additionally employ a "machining" Focused Ion Beam (FIB), allowing supportive activities such as ion-beam milling or Ion-Beam-Induced Deposition (IBID), for example. More specifically:

- In a SEM, irradiation of a specimen by a scanning electron beam precipitates emanation of "auxiliary" radiation from the specimen, in the form of secondary electrons, backscattered electrons, X-rays and photoluminescence (infrared, visible and/or ultraviolet photons), for example; one or more components of this flux of emanating radiation is/are then detected and used for image accumulation purposes.
- In a TEM, the electron beam used to irradiate the specimen is chosen to be of a high-enough energy to penetrate the specimen (which, to this end, will generally be thinner than in the case of a SEM specimen); the flux of transmitted electrons emanating from the specimen can then be used to create an image. When such a TEM is operated in scanning mode (thus becoming a STEM), the image in question will be accumulated during a scanning motion of the irradiating electron beam.

More information on some of the topics elucidated here can, for example, be gleaned from the following Wikipedia links:

http://en.wikipedia.org/wiki/Electron_microscope
http://en.wikipedia.org/wiki/Scanning_electron_microscope
http://en.wikipedia.org/wiki/Transmission_electron_microcopy
http://en.wikipedia.org/wiki/Scanning_transmission_electron_microscopy As an alternative to the use of electrons as irradiating beam, charged-particle microscopy can also be performed using other species of charged particle. In this respect, the phrase "charged particle" should be broadly interpreted as encompassing electrons, positive ions (e.g. Ga or He ions), negative ions, protons and positrons, for instance. As regards ion-based microscopy, some further information can, for example, be gleaned from sources such as the following:

http://en.wikipedia.org/wiki/Scanning_Helium_Ion_Microscope

W. H. Escovitz, T. R. Fox and R. Levi-Setti, *Scanning Transmission Ion Microscope with a Field Ion Source*, Proc. Nat. Acad. Sci. USA 72(5), pp 1826-1828 (1975).

It should be noted that, in addition to imaging, a charged-particle microscope (CPM) may also have other functionalities, such as performing spectroscopy, examining diffractograms, performing (localized) surface modification (e.g. milling, etching, deposition), etc.

Apart from using charged particles as irradiating beam, it is also possible to perform scanning microscopy using a photon beam. An example of such a technique is so-called confocal microscopy, in which scanning irradiation by a point source of photons stimulates localized emanation of fluorescence radiation from the specimen. A detector can be used to collect (part of) this flux of fluorescence radiation and accumulate an image on the basis thereof. More information on this topic can, for example, be gleaned from the following Wikipedia link:

http://en.wikipedia.org/wiki/Confocal_microscopy

In all cases, a scanning-type microscope will comprise at least the following components:

- A radiation source, such as a Schottky source or ion gun in the case of a CPM, or a laser or lamp in the case of an optical microscope.
- An illuminator, which serves to manipulate a "raw" radiation beam from the source and perform upon it certain operations such as focusing, aberration mitigation, cropping (with an aperture), filtering, etc. It will generally comprise one or more (charged-particle) lenses, and may comprise other types of (particle-) optical component also. If desired, the illuminator can be provided with a deflector system that can be invoked to cause its output beam to perform a scanning motion across the specimen being investigated.
- A specimen holder, on which a specimen under investigation can be held and positioned (e.g. tilted, rotated). If desired, this holder can be moved so as to effect the desired scanning motion of the beam w.r.t. the specimen. In general, such a specimen holder will be connected to a positioning system such as a mechanical stage.
- A detector, which may be unitary or compound/distributed in nature, and which can take many different forms, depending on the radiation being detected. Examples include photomultipliers (including solid-state photomultipliers, SSPMs), photodiodes, CMOS detectors, CCD detectors, photovoltaic cells, etc., which may, for example, be used in conjunction with a scintillator film, for instance.

Methods as set forth in the opening paragraph above have been extensively developed in recent years by the assignee of the current application (FEI Company, Hillsboro, Oreg., USA). In particular, the following notable publications deserve mention:

(i) U.S. Pat. No. 8,232,523/EP 2 383 768 B1, in which P is a property of the (incoming) radiation beam—such as beam energy, beam convergence angle or beam focal depth—and spatial resolution (deconvolution) of M is performed using a statistical Blind Source Separation (BSS) algorithm.

(ii) U.S. Pat. No. 8,581,189/EP 2 557 586 B1, in which P is again a property of the (incoming) radiation beam—such as beam energy, beam convergence angle or beam focal depth—and deconvolution of M is performed using a generalized three-dimensional reconstruction technique, e.g. on the basis of a Bayesian statistical approach.

(iii) U.S. Pat. No. 8,586,921/EP 2 557 587 A2, in which P is a property of the (emanating) radiation flux—specifically emission angle (e.g. of emitted secondary electrons)—and deconvolution of M is again conducted using a general volumetric reconstruction algorithm.

(iv) U.S. Pat. No. 8,704,176/EP 2 648 208 A2, in which P is again a property of the (emanating) radiation flux—specifically energy of emitted electrons—and deconvolution of M is once more achieved using three-dimensional reconstructive mathematics.

In deconvolving M, one can, for example, spatially resolve it into a result set $R=\{(V_k, L_k)\}$, in which a spatial variable V demonstrates a value $V_k$ at an associated discrete depth level $L_k$ referenced to the surface S, k being a member of an integer sequence, and spatial variable V representing a physical property of the specimen as a function of position in its bulk, e.g. contrast, intensity, density variation, atomic weight, staining concentration, electron yield/X-ray yield, etc., all of which are directly or indirectly determined by physical characteristics of (the material of) the specimen, and on the basis of which it is possible to construct an entity such as an image, map or spectrum, for example. In this way, one converts an inherently degenerate signal from the specimen into a depth-referenced image stack. A general way of solving this deconvolution problem is (for example) to:

Define a Point Spread Function (PSF) that, for each value of n, has a kernel value $K_n$ representing a behavior of said (incoming) beam of radiation in a bulk of the specimen as perceived by the detector for measurement parameter value $P_n$.

Define an imaging quantity that, for each value of n, has a value $Q_n$ that is a multi-dimensional convolution of $K_n$ and V, such that $Q_n = K_n * V$;

For each value of n, computationally determine a minimum divergence $$\min D(D_n \| K_n * V)$$

between $D_n$ and $Q_n$, wherein one solves for V while applying constraints on the values $K_n$. It will be clear to the skilled artisan that, although such deconvolution may be depth-referenced, it is generally not depth-confined. Because a general PSF will have lateral spread, the deconvolution yields full volumetric imagery of the specimen, but (if desired) allows such imagery to be rendered on a layer-by-layer basis ("computational slicing" in the depth direction).

The above-mentioned techniques have produced a revolution in computational electron microscopy, allowing detailed SEM tomography to be performed as never before. Whereas the examples given above specifically involve the use of charged particles (such as electrons) in the irradiating beam, the basic principles involved can also be exploited in scanning-type optical microscopes, in which the irradiating beam comprises photons.

Although techniques such as those set forth above produce satisfactory results, the current inventors have worked extensively to improve them even further. The results of this endeavor are the subject of the current application.

It is an object of the invention to provide an improved method of the type set forth in the opening paragraph above. In particular, it is an object of the invention that such a method should offer greater imaging resolution than presently provided by methods of this kind.

These and other objects are achieved in a method as set forth in the opening paragraph, characterized in that, considered at a given point $p_i$ within the specimen, the method comprises the following steps:

In a first probing session, employing a first beam configuration $B_1$ to irradiate the point $p_i$ with an associated first Point Spread Function $F_1$, whereby said beam configuration is different to said measurement parameter;

In at least a second probing session, employing a second beam configuration $B_2$ to irradiate the point $p_i$ with an associated second Point Spread Function $F_2$, whereby:
$F_2$ overlaps partially with $F_1$ in a common overlap zone $O_i$ in which point $p_i$ is located;
$F_1$ and $F_2$ have respective non-overlapping zones $F_1'$ and $F_2'$ outside of $O_i$, Using a Source Separation algorithm in said computer processing apparatus to perform image reconstruction in said overlap zone $O_i$ considered separately from said non-overlapping zones $F_1'$ and $F_2'$.

The crux of the current invention can be set forth in terms of mathematical considerations (see Embodiments below), but it can also be explained on the basis of a simplified physical elucidation. Basically, the inventive approach is ensuring that the point $p_i$ of the specimen located in overlap zone $O_i$ will be subjected to (at least) two different regions/portions/aspects of the functional form $f_{PSF}$ of a PSF (which serves to describe physical interaction between the beam and the specimen). In this way, the technique of the current invention causes point $p_i$ (and the rest of zone $O_i$) to be "probed" by, for example:

A "deeper region" of $f_{PSF}$ during the first probing session and an "shallower region" of $f_{PSF}$ during the second probing session; or A "left portion" of $f_{PSF}$ during the first probing session, and a "right portion" of $f_{PSF}$ during the second probing session, etc. The inventive deconvolution procedure accordingly exploits the fact that the overlap zone $O_i$ has been probed by these (at least) two different regions/portions of $f_{PSF}$, in a somewhat similar manner to the way in which stereo vision allows an object to be pinpointed more accurately than mono vision, or range determination from multiple points allows an object to be more accurately located (triangulated) than range determination from just one point. One can alternatively grasp the invention by considering it in one or more of the following manners:

Since the overlap zone $O_i$ is, by definition, smaller than the individual PSFs contributing to it, the inventive approach provides a finer-scale spatial resolution than "raw" prior-art techniques such as those set forth above. The present invention may thus be regarded as producing a super-resolution imaging result.

The invention concentrates on common components of the overlapping PSFs in isolation from uncommon components, thus cutting out "dead wood" from the spatial resolution procedure.

Since overlap zone $O_i$ is inspected in multiple probing sessions, signal-to-noise ratio is inevitably improved.

Each probing of $O_i$ by a different region/portion of $f_{PSF}$ can be regarded as a means to establish a further member of a set of simultaneous equations describing $O_i$; the more simultaneous equations that one obtains, the more defined the solution space becomes.

Examples of Source Separation (SS) techniques suitable for use in the current invention include, for instance:
- Independent Component Analysis (ICA), which is a technique that allows a multivariate signal to be separated into additive sub-components;
- Principal Component Analysis (PCA);
- Non-negative Matrix Factorization (NNMF), etc., which may particularly lend themselves to application in specific situations. For some general information on such techniques, see, for example, the following references:
http://en.wikipedia.org/wiki/Independent_component_analysis
The abovementioned patents U.S. Pat. No. 8,232,523/EP 2 383 768 B1.
[1] P. Comon and C. Jutten, *Handbook of Blind Source Separation: Independent Component Analysis and Applications*, Academic Press (2010).
[2] A. Hyvärinen and E. Oja, *Independent Component Analysis: Algorithms and Applications*, Neural Networks, 13(4-5):411-430 (2000).
[3] H. Lantëri, M. Roche, C. Aime, "*Penalized maximum likelihood image restoration with positivity constraints: multiplicative algorithms, Inverse Problems*," vol. 18, pp. 1397-1419 (2002).
[4] I. T. Jolliffe, *Principal Component Analysis*, Series: Springer Series in Statistics XXIX, 2nd ed., Springer, N.Y. (2002).

In the context of this recitation and the further elucidation below, the following points should be borne in mind:
(a) The abovementioned first and second probing sessions may, if desired, be supplemented by further probing sessions at point $p_i$, thus leading to accumulation of a general set $F=\{F_1, F_2, F_3, \ldots, F_j, \ldots\}$ of partially overlapping PSFs.
(b) The inventive procedure at a given point $p_i$ can be repeated at a whole train $p=\{pi\}$ of (successive) points along (below) the scan path. The associated overlap zones $O_i$ will then effectively "merge" into a larger tract $O=\{O_i\}$, e.g. in the form of a particular (sub-surface) stratum/volume in the specimen (see FIGS. 1B and 2B, for example). As explained above, "standard" spatial resolution can then be realized outside of O, but the current invention allows augmented spatial resolution to be achieved within O.
(c) In respect of the preceding item, one has, for example, the freedom to:
  (I) Deploy a full set F at point $p_i$, and then repeat this procedure at each subsequent point in p ("full F before each step in p"); or
  (II) Deploy PSF $F_j$ at each point in $p_i$, and then repeat this procedure for each subsequent PSF in F ("full p before each step in F").
(d) The various probing sessions at point $p_i$ may, in principle, be performed serially or concurrently, whereby:
  In the former case (serial probing), point $p_i$ is first irradiated by a first beam having beam configuration $B_1$, and is thereafter irradiated by a second beam having beam configuration $B_2$, etc.
  In the latter case (concurrent probing), multiple beams are used to simultaneously irradiate point $p_i$, at a range of (co-existing) mutually different beam configurations.
The skilled artisan will readily understand these points.

It should be explicitly noted that the present invention is fundamentally different in nature to the inventions set forth in patent documents (i)-(iv) above. In documents (i)-(iv), the measurement parameter P is varied as a way of obtaining (convoluted) imaging information from a series of (successive) depth layers within a specimen, i.e. adjustment of parameter P is regarded as a tool for probing deeper and deeper into the specimen. On the other hand, in the present invention, variation of parameter P is effectively a tool to tailor the size/shape of a "higher-order" (overlapping) PSF portion ($O_i$)—at a given position within a specimen—so as to be able to perform super-resolution image reconstruction in an area smaller than the footprint of a probing beam at said position. Lateral scanning motion of the probing beam can be exploited to extend said position into a layer (which could be surfacial or sub-surface) but, in its most fundamental form, the invention does not intrinsically yield bulk/volume imaging throughout different depths of the specimen (though such depth-resolved information could ultimately be obtained by using the extended invention on a (stacked) layer-by-layer basis).

In a particular embodiment of the present invention, the following specific aspects apply:
- Said surface is defined to extend parallel to an XY-plane of a Cartesian coordinate system XYZ
- Said beam configuration is chosen to be a Z-position of a point of entry of the beam into the specimen;
- Between said first and second probing sessions, a physical slicing procedure is used to remove a layer of material of thickness L from an initial surface $S_1$, thereby exposing a new surface $S_2$;
- Point Spread Functions $F_2$ and $F_1$ are displaced relative to one another in said Z-direction by an amount L.

The mechanism of this embodiment can be explained as follows (see FIG. 1A):
- Consider $p_i$ in the specimen to be located at a Z-distance L+z below $S_1$, where z is some positive increment.
- In the first probing session, the incoming radiation beam $B_1$ will impinge on $S_1$ and produce a PSF $F_1$ that extends down into the specimen from $S_1$; point $p_i$ will then be located at a Z-distance L+z into this PSF $F_1$.
- A physical slicing procedure (such as ion milling, microtome cutting, etching, etc.) is now used to remove a layer of thickness L from old surface $S_1$, thereby exposing a fresh surface $S_2$.
- In the second probing session, the incoming radiation beam $B_2$ will impinge on $S_2$ and produce a PSF $F_2$ that extends down into the specimen from $S_2$; point $p_i$ will then be located at a Z-distance z into this PSF $F_2$. The PSFs $F_1$ and $F_2$ demonstrate a partial overlap zone $O_i$. Beams $B_1$ and $B_2$ have a common propagation axis $b_{12}$, which extends parallel to the Z-direction.
- The PSFs $F_1$ and $F_2$ can have (approximately) the same functional form $f_{PSF}$ (e.g. an ovaloid, which starts with a narrow neck at the point of impingement of the beam, widens as one progresses into the specimen (lateral spread) and then tapers again with increasing extinction), but the overlap zone $O_i$ containing $p_i$ will be subjected to a different Z-region of each. This fact allows an SS algorithm (such as ICA) to be used in performing detector signal deconvolution within zone $O_i$, resulting in augmented spatial resolution in this zone (compared to the prior art).
- As set forth in item (b) above, this effect need not be limited to just the zone $O_i$ in which point $p_i$ is located; instead, if lateral scanning is performed during the first and second probing sessions, then zone $O_i$ will be just one component of a merged tract (e.g. stratum/volume) O, located below $S_2$, for which the current invention can realize improved spatial resolution. See, for example, FIG. 1B in this regard.

If desired, the procedure set forth above can be repeated in further iterations, whereby one progressively ventures deeper and deeper into the specimen, thus creating a stack of sub-surface tracts/strata O in which improved spatial resolution can be obtained. Such a scenario is, for example, illustrated in FIG. 1C.

The skilled artisan will understand that, in the current situation, approach (I) above cannot be employed, since there is an irreversible, destructive step (layer removal) between probing sessions; instead, approach (II) may be employed. In this context, it should be noted that:

A whole measurement set $^1M$ can be obtained for PSF $F_1$ (at each point $p_i$ in p), by varying a measurement parameter $^1P$ and recording the attendant detector output.

Similarly, a whole measurement set $^2M$ can be obtained for PSF $F_2$ (at each point $p_i$ in p), by varying a measurement parameter $^2P$ and recording the attendant detector output, whereby $^2P$ and $^1P$ may be the same or different.

Each of these measurement sets $^1M$, $^2M$ separately allows a spatially resolved image of (part of) the specimen to be generated; however, using the current inventive insights, a higher-resolution image may be obtained for the above-mentioned overlap tract O.

It should be noted that prior-art techniques (i)-(iv) above discuss the combined use of physical slicing and tomography, but that this is only to increase the achievable range of such tomography into the specimen; there is no teaching in the prior art vis-à-vis the exploitation of overlapping PSFs in the Z-direction, or the application of SS algorithms to achieve improved spatial resolution in the overlap zone(s)/tract(s) concerned.

In an alternative embodiment of the current invention, the following specific aspects apply:

Said beam configuration is chosen to be an angle of the beam relative to the surface S (most generally considered in three dimensions);

Between said first and second probing sessions, said angle of the beam is adjusted.

Point Spread Functions $F_2$ and $F_1$ are angled relative to one another.

The mechanism of this embodiment can, for example, be explained as follows (see FIG. 2A).

Define a tilt angle T (declination/pitch) w.r.t. the surface S.

In the first probing session, the incoming radiation beam $B_1$ impinges on S at tilt $T_1$, and produces a PSF $F_1$ that extends into the specimen along propagation axis $b_1$ and that intersects sub-surface point $p_i$. If $T_1 \neq 90°$, then such impingement/extension will be oblique (otherwise it will be normal/perpendicular).

In the second probing session, the incoming radiation beam $B_2$ impinges on S at a different tilt $T_2$, producing a PSF $F_2$ that extends into the specimen along propagation axis $b_2$ at a different slope, and again intersects point $p_i$.

Since $T_2 \neq T_1$, point $p_i$ will experience different regions/aspects of PSFs $F_1$ and $F_2$ as measured along their respective propagation axes $b_1$, $b_2$. This fact allows an SS algorithm (such as ICA) to be used in performing detector signal deconvolution within zone $O_i$, resulting in augmented spatial resolution in this zone (compared to the prior art).

Once again, as set forth in item (b) above, this effect need not be limited to just the zone $O_i$ in which point $p_i$ is located; instead, if lateral scanning is performed during the first and second probing sessions, then zone $O_i$ will be just one component of a merged tract (e.g. stratum/volume) O, located below S, for which the current invention can realize improved spatial resolution. See, for example, FIG. 2B in this regard.

It should be noted that, in addition to a tilt angle T—which measures declination/pitch in a vertical plane (containing the Z-axis)—it is also possible to define an azimuthal angle A—which measures orbital angle/yaw in a horizontal plane (parallel to the XY plane). In the situation shown in FIG. 2A, the beams $B_1$ and $B_2$ have different azimuthal angles ($A_1$ and $A_2$, respectively)—in particular, the beams $B_1$ and $B_2$ oppose each other diametrically, with a difference of 180° between their azimuthal angles; however, this does not have to be the case, and the beams $B_1$ and $B_2$ could just as validly approach point $p_i$ with the same azimuthal angle. Moreover, beams $B_1$ and $B_2$ could also approach point $p_i$ with the same tilt angle, but with different azimuth angles. These points also receive attention in Embodiment 1 below.

Care should be taken not to confuse the "variable beam angle" embodiment of the previous paragraph with known—and very different—techniques such as so-called "micro-rotation". The technique of micro-rotation can be regarded as being an angular version of so-called confocal imaging, which is linear in nature. In confocal imaging, a focal plane is linearly displaced in (incremental) steps through a specimen, whereas, in micro-rotation, a sample is angularly rotated through a focal plane; in both cases, the intention is to "sweep" the focal plane (either linearly or angularly) through an extended volume of the specimen. In contrast, in the inventive embodiment of the previous paragraph, the purpose of beam tilt is to create a localized overlap zone (of adjustable size/shape/location) between different PSFs, for the purpose of defining a confined region in which super-resolution image reconstruction is to occur.

In a further embodiment of the current invention, the following specific aspects apply:

Said beam configuration is selected to be a species of particle in said beam;

Point Spread Functions $F_2$ and $F_1$ are mutually different as regards at least one of size and shape.

The mechanism of this embodiment can be explained as follows (see FIG. 3A).

Consider the term "species" as here employed to refer to characteristics such as electrically charged or uncharged, sign of electrical charge, relatively heavy or light, relatively long- or short-wavelength, etc. In this context, particles such as electrons, protons, relatively light ions (e.g. He ions), relatively heavy ions (e.g. Ga ions), photons, soft or hard X-rays, etc., are considered to be different species of particle.

Such different species of particle will generally demonstrate different interactions with a given specimen, with associated differences in the shape and/or size of the attendant PSF.

In the first probing session, the incoming radiation beam $B_1$ comprises a first species of particle. When this beam $B_1$ impinges on S, it produces—for example—a PSF $F_1$ that extends to a relatively deep level into the specimen, but with relatively little lateral spread. This PSF $F_1$ intersects point $p_i$.

In the second probing session, the incoming radiation beam $B_2$ comprises a second species of particle. When this beam $B_2$ impinges on S, it produces—for example—a PSF $F_2$ that extends to a relatively shallow level into the specimen, but with greater lateral spread than in the case of beam $B_1$. This PSF $F_2$ also intersects point $p_i$.

Since PSFs $F_2$ and $F_1$ differ in size and/or shape, point $p_i$ will experience different regions/portions/aspects of each. This fact allows an SS algorithm to be used in performing detector signal deconvolution within zone $O_i$, resulting in augmented spatial resolution in this zone (compared to the prior art).

Once again, as set forth in item (b) above, this effect need not be limited to just the zone $O_i$ in which point $p_i$ is located; instead, if lateral scanning is performed during the first and second probing sessions, then zone $O_i$ will be just one component of a merged tract (e.g. stratum/volume) O, located below S, for which the current invention can realize improved spatial resolution. See, for example, FIG. 3B in this regard.

If desired, various combinations/hybrids of the above-mentioned Embodiments can be employed, all within the scope of the current invention. For example:

After the situation depicted in FIG. 2B has been enacted, a physical slicing procedure can be used to remove a layer of material of thickness L from the specimen, thereby exposing a new surface (refer to FIG. 1A); the situation shown in FIG. 2B can then be repeated on this newly exposed surface. A similar statement applies to the situation depicted in FIG. 3B, for example.

The beams of FIGS. 1A and 3A may, if desired, be shot obliquely into the specimen rather than normally.

etc.

The invention will now be elucidated in more detail on the basis of exemplary embodiments and the accompanying schematic drawings, in which:

FIG. 1A renders a cross-sectional view of a specimen that is being imaged according to a particular embodiment of the current invention. FIG. 1B shows the technique of FIG. 1A applied at multiple laterally displaced points. FIG. 1C shows the technique of FIG. 1A iterated at additional depths.

FIG. 2A renders a cross-sectional view of a specimen that is being imaged according to another embodiment of the current invention. FIG. 2B shows the technique of FIG. 2A applied at multiple laterally displaced points.

FIG. 3A renders a cross-sectional view of a specimen that is being imaged according to yet another embodiment of the current invention. FIG. 3B shows the technique of FIG. 3A applied at multiple laterally displaced points FIG. 4 renders a cross-sectional view of an embodiment of a scanning-type microscope according to the present invention.

In the Figures, where pertinent, corresponding parts are indicated using corresponding reference symbols.

EMBODIMENT 1

Figure 2A:
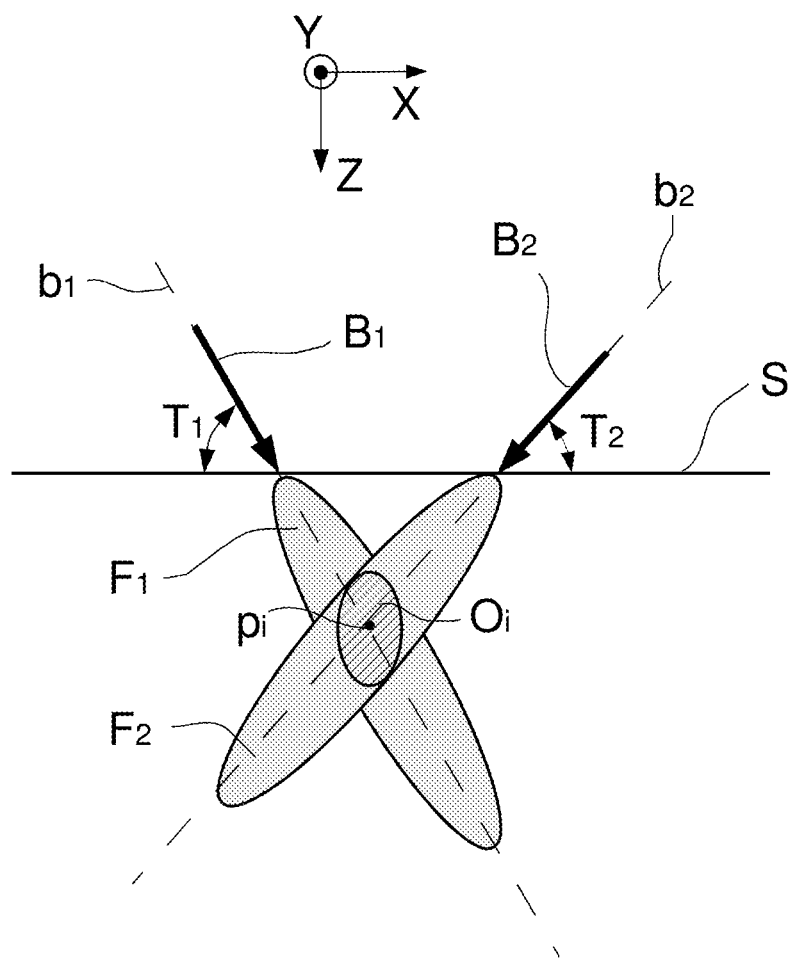

FIG. 2A renders a cross-sectional view of a specimen that is being imaged according to given embodiment of the current invention. As already alluded to above, this Figure illustrates the following:

A first incoming radiation beam $B_1$ that impinges on specimen surface S at tilt $T_1$, and produces a PSF $F_1$ that extends into the specimen along propagation axis $b_1$, and that intersects sub-surface point $p_i$.

A second incoming radiation beam $B_2$ that impinges on S at a different tilt $T_2$, producing a PSF $F_2$ that extends into the specimen along propagation axis $b_2$ at a different slope, and again intersects point $p_i$.

Since $T_2 \neq T_1$, point $p_i$ experiences different regions/aspects of PSFs $F_1$ and $F_2$ as measured along their respective propagation axes $b_1$, $b_2$. This fact allows an SS algorithm to be used in performing detector signal deconvolution within zone $O_i$, resulting in augmented spatial resolution in this zone. This will now be explained in more detail.

When scanning the surface S of the specimen, one collects the detector output for each scan position, thus forming an "image" D. In the reconstruction scheme discussed here, one is acquiring images using a scanning beam oriented at respective 'azimuthal' (yaw) and 'tilt' (pitch, declination) angles (A, T) with respect to a reference frame (XYZ) whose Z-axis is normal to the surface S (XY plane) of the specimen (azimuthal angle A not depicted in FIG. 2). These images are here labeled $D_{A,T}$. For simplicity, the following will limit itself to a situation wherein the azimuthal angles are separated by 180° (opposite directions). Two images are acquired (either serially or concurrently) at respective tilt angles $T_1$ and $T_2$ (a special case is $T_1=T$ and $T_2=-T$), and these two images are respectively labeled $D_{T_1}$ and $D_{T_2}$. For $D_{T_1}$, the collection of detected signals at the visited scan locations is obtained from the collection of volumes covered by the PSF $F_1$. In the case of $D_{T_2}$, the imaging process uses the PSF $F_2$. Obtaining a sharper image, coming from a set of less extended volumes in the specimen, can be achieved by 'shifting' one of the tilt images (for example $D_{T_1}$) by a certain number of "pixels" with respect to the other image. The amount of such shift will determine the subsurface location of a volume of intersection of the two PSFs $F_1$ and $F_2$, which intersection volume is labeled $O_i$ in FIG. 2A. When there is no X-shift, said intersection volume $O_i$ lies immediately underneath the surface S. Extracting the signal coming exclusively from the collection of intersection volumes $O_i$ (for all scan locations) can be done using statistical source separation techniques such as Independent Component Analysis (ICA), for example.

For further explanation, one can define:

$F_1' = F_1 \backslash O_i$ as the volume covered by the PSF $F_1$ excluding intersection region $O_i$; and $F_2' = F_2 \backslash O_i$ as the volume covered by the PSF $F_2$ excluding intersection region $O_i$.

The three volumes corresponding to $F_1'$, $F_2'$, and $O_i$ are non-overlapping, and one can define three "virtual images" $D_{F_1}'$, $D_{F_2}'$, and $D_{O_i}$ corresponding to these virtual PSFs (volumes). Such virtual images will have lower statistical correlation than the original images.

In the case of linear imaging models, one obtains:

$$D_{T_1} = D_{F_1}' + D_{O_i} \qquad (1)$$

$$D_{T_2} = D_{F_2}' + D_{O_i} \qquad (2)$$

This model applies in the case where the beam parameters (such as current/particle flux or acceleration voltage) are identical for the two scans (probing sessions). If one of the beams has a different "intensity" (i.e. greater or lesser importance/influence/"gravity"), a relative weight a given to the intersection region will change from a value of 1.0, resulting in the more general expressions:

$$D_{T_1} = D_{F_1}' + \alpha D_{O_i} \quad (3)$$

$$D_{T_2} = D_{F_2}' + D_{O_i} \quad (4)$$

or, in matrix form:

$$D = WD' \quad (5)$$

with:

$$D = \begin{pmatrix} D_{T_1} \\ D_{T_2} \end{pmatrix}, D' = \begin{pmatrix} D_{F_1}' \\ D_{F_2}' \\ D_{O_i} \end{pmatrix}, \text{ and } W = \begin{bmatrix} 1 & 0 & \alpha \\ 0 & 1 & 1 \end{bmatrix} \quad (6)$$

The problem to be solved here consists of recovering the virtual images $D_{F_1}'$, $D_{F_2}'$, and $D_{O_i}$ from the 'observed' ones $D_{T_1}$ and $D_{T_2}$. The main emphasis, as explained earlier, will be on $D_{O_i}$, which should correspond to a sharper image. Solving the generally ill-posed decomposition/factorization problem set forth in equation (5) can (for example) be done using ICA techniques with regularization methods. The general problem is formulated as follows:
Find the pair $(\hat{W}, \hat{D}')$ that satisfies:

$$(\hat{W}, \hat{D}') = \operatorname{argmin}_{W,D'} J(D \| WD') \quad (7)$$

where the criterion $J(.\|.)$ is a statistical similarity measure between model and observations. Typical choices for $J(.\|.)$ are the least squares measure for signals with Gaussian noise, or the Kullback-Leibler divergence for Poisson noise, for instance. Other divergences can be used as well: see, for example, the above-referenced U.S. Pat. No. 8,581,189 (item (ii) above), col. 5, line 33-col. 6, line 33.

For better convergence, and to restrict the space of solutions, a regularization term can be added to (7), yielding:

$$(\hat{W}, \hat{D}') = \operatorname{argmin}_{W,D'} \{J(D \| WD') + \lambda R(W, D', \theta)\} \quad (8)$$

The regularization term $R(W, D', \theta)$ represents prior-knowledge constraints, and may depend on the decomposition variables $(W, D')$ as well as on other parameters $\theta$ that emerge from simulations and measurements. For example, one could use:
- Parameters for an analytical model of a scanning beam's interaction with a specific class of materials (such as plastic-embedded heavy-particle-stained specimens, for example);
- Parameters constraining the geometry and contrast of the reconstructed structures: for example, synaptic vesicles are, on average, spherical and have a diameter of approximately 39.5 nm, etc.

One can see that, in problems (7) and (8), optimizing with respect to W boils down to optimizing with respect to a. Ultimately, as mentioned earlier, the most important component to recover is $D_{O_i}$, which is the image corresponding to the smaller "intersection volume".

An Alternating Least Squares (ALS) Algorithm

What follows is an example of solving for (7) in the case of a least squares measure. In this case, one solves for:

$$(\hat{W}, \hat{D}') = \operatorname{argmin}_{W \geq 0, D' \geq 0} \| D - WD' \|^2 \quad (9)$$

which is typically regularized using non-negativity conditions, as indicated in (9) by the stipulations $W \geq 0, D' \geq 0$. This problem can be approached by alternating two minimization steps, with respect to W and D'. In the first step, one computes a derivative with respect to W and sets it to zero:

$$\frac{\partial \| D - WD' \|^2}{\partial W} = 0 \quad (10)$$

From which one obtains:

$$D' = (W^T W)_{-1} W^T D \quad (11)$$

Differentiating the least squares criterion with respect to D' and setting to zero leads to:

$$W = DD'^T (D'D'^T)^{-1} \quad (12)$$

In the ALS algorithm, the two steps (11) and (12) are alternated until a suitable convergence criterion is achieved. The aforementioned non-negativity constraints are imposed, for example, by setting negative values to zero, or by employing a so-called active set technique, as described (for example) in references [1] and [2] above.

ICA with Kullback-Leibler Divergences (EMML)

In this case, one minimizes the following so-called Generalized Kullback-Leibler (KL) divergence:

$$KL(D \| WD') = \Sigma_x D(x) \log\left(\frac{D(x)}{WD'(x)}\right) - \Sigma_x (D - WD')(x) \quad (13)$$

where x is a variable spanning the image coordinates space. In such a formulation, the recovery of the different image components and of the weights matrix is typically achieved using the Expectation Maximization Maximum Likelihood (EMML) algorithm (see reference [3] above, for example). This algorithm is built on the following two iterations:

$$W_{ij} = W_{ij} \left( \frac{\Sigma_k (D_{ik} / [WD']_{ik}) D_{jk}'}{\Sigma_k D_{jk}'} \right) \quad (14)$$

$$D_{jk} = D_{jk}' \left( \frac{\Sigma_i W_{ij} (D_{ik} / [WD']_{ik})}{\Sigma_i W_{ij}} \right) \quad (15)$$

where the indices i, j, and k are used to refer to elements of the different matrices, and where left hand quantities are values being computed at iteration t+1, and right hand quantities are values obtained at iteration t.

Figure 2B:
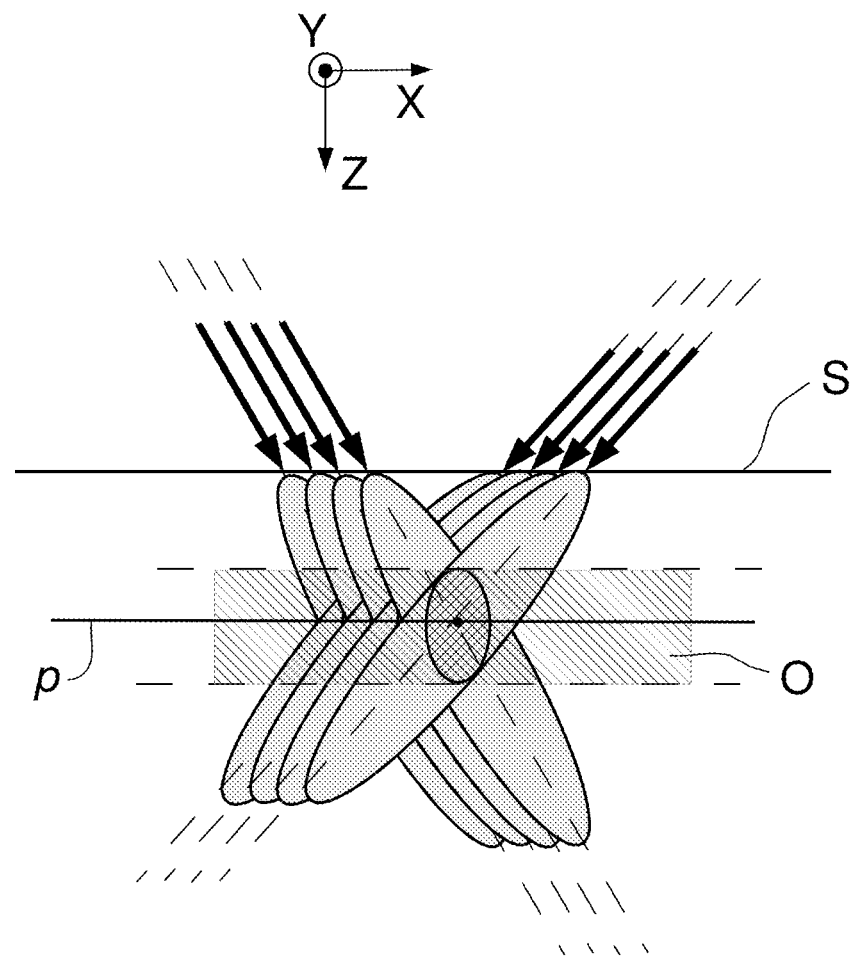

FIG. 2B has already been discussed in the general Description above, and requires no further elucidation here.

EMBODIMENT 2

Figure 1A:
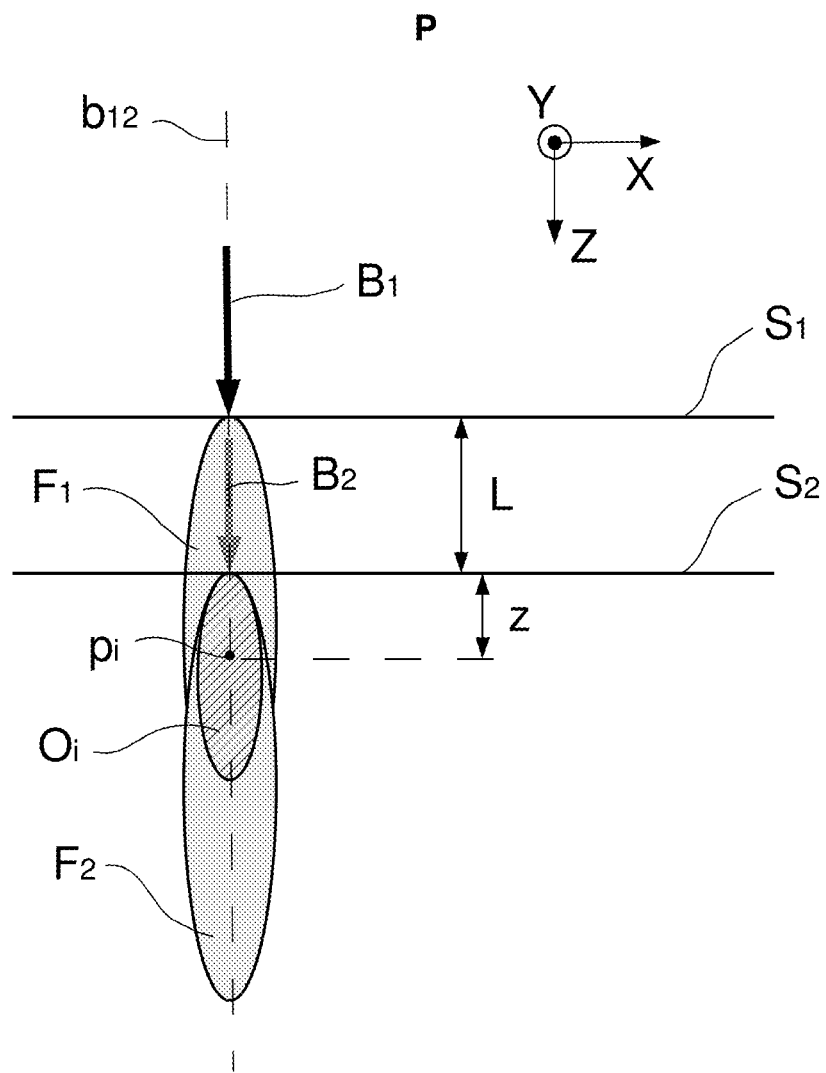

FIG. 1A renders a cross-sectional view of a specimen that is being imaged according to another embodiment of the current invention. As already alluded to above, this Figure schematically depicts the following:
- A first incoming radiation beam $B_1$ that impinges on (original) specimen surface S, and produces a PSF $F_1$ that extends down into the specimen from $S_1$; point $p_i$ is located at a Z-distance L+z into this PSF $F_1$.
- A second incoming radiation beam $B_2$ that impinges on (newly exposed) specimen surface on $S_2$ and produces a PSF $F_2$ that extends down into the specimen from $S_2$; point $p_i$ is located at a Z-distance z into this PSF $F_2$. This new surface $S_2$ was created by utilizing a physical slicing procedure (such as ion milling, microtome cutting, etching, etc.) to remove a layer of thickness L from old surface $S_1$, thereby exposing a fresh surface $S_2$.

The PSFs $F_1$ and $F_2$ demonstrate a partial overlap zone $O_i$. Beams $B_1$ and $B_2$ have a common propagation axis $b_{12}$, which extends parallel to the Z-direction. The overlap zone $O_i$ containing $p_i$ will be subjected to a different Z-region of each PSF. This fact allows (for example) ICA to be used in performing detector signal deconvolution within zone $O_i$, resulting in augmented spatial resolution in this zone. This will now be explained in more detail.

In the case of reconstructions from multiple imaging sessions at different surfaces, one can follow the same reasoning as in Embodiment 1 above and define three PSFs: $F_1'=F_1\backslash O_i$, $F_2'=F_2\backslash O_i$, and $O_i$. From FIG. 1A one can see that, in this case, the "virtual images" $D_{F_1}'$, $D_{F_2}'$, and $D_{O_i}$ correspond to volumes stacked from the top to the bottom. Each of these "virtual" volumes will have less thickness than the two original ones, and hence should correspond to sharper images with fewer volume effects. If one defines the images obtained at surfaces $S_1$ and $S_2$ as $D_{S_1}$ and $D_{S_2}$, respectively, one can derive the relationship between the observed and "virtual" images as follows:

$$D_{S_1}=D_{F_1}'+D_{O_i} \quad (16)$$

$$D_{S_2}=D_{F_2}'+D_{O_i} \quad (17)$$

If one accounts for a change in imaging conditions that introduces different "intensity" scaling $\alpha$ between the two sessions, one obtains:

$$D_{S_1}=D_{F_1}'+\alpha D_{O_i} \quad (18)$$

$$D_{S_2}=D_{F_2}'+D_{O_i} \quad (19)$$

which leads to the matrix representation:

$$D_S=WD'(20)$$

with $$D_S = \begin{pmatrix} D_{S_1} \\ D_{S_2} \end{pmatrix}$$

and W and D' defined as in (6).

Using the same ICA techniques as described above, one can recover the three images corresponding to the three layers from top to bottom.

Figure 1B:
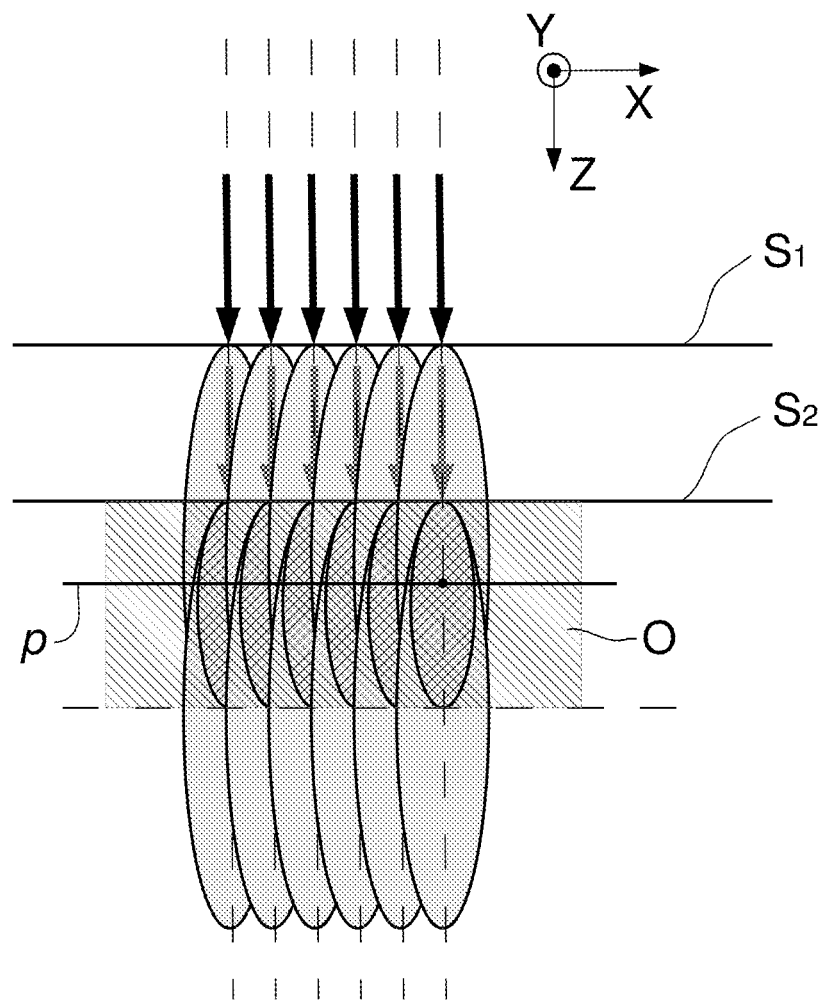
Figure 1C:
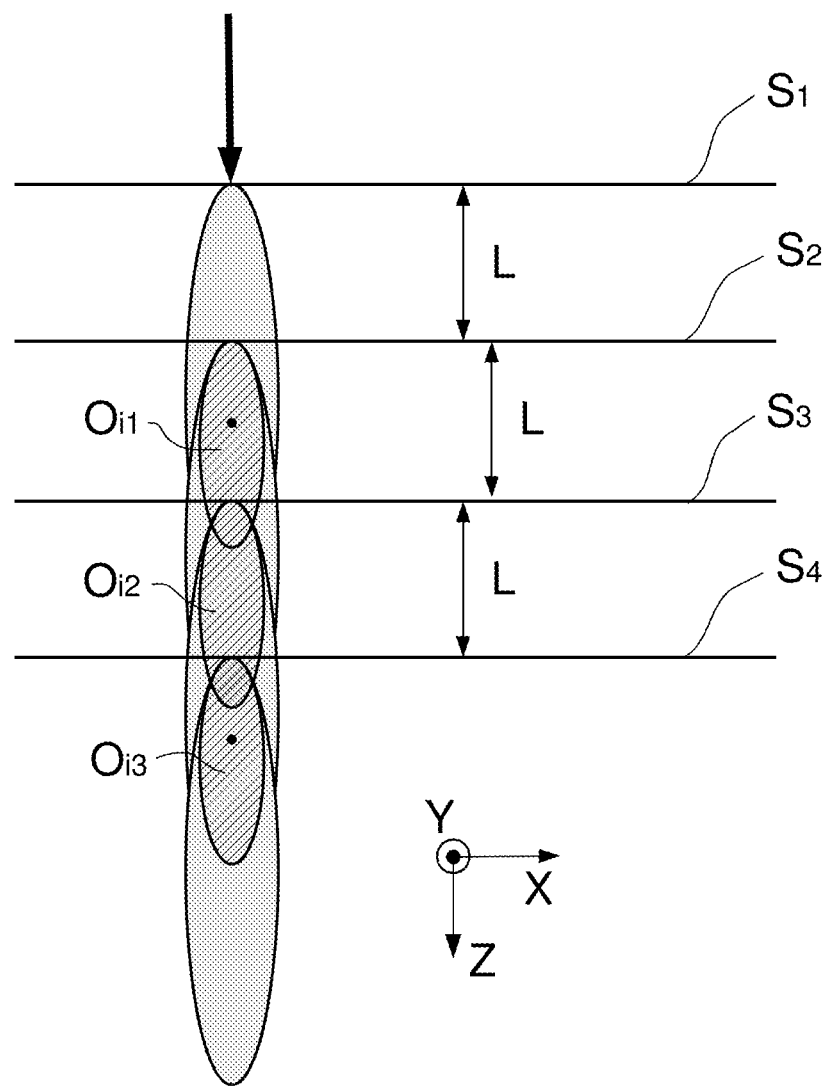

FIGS. 1B and 1C have already been discussed in the general Description above, and require no further elucidation here.

EMBODIMENT 3

It will be well within the ambit of the skilled artisan to extend the reconstruction techniques described above to more than two scans (probing sessions). For the multi-tilt case of Embodiment 1, for example, the different PSFs should in that case intersect in the same common ("pivot") region. The linearity of the imaging process will always result in decompositions represented by systems of equations similar to (5) and (20). Such systems can be solved using identical computational methods.

EMBODIMENT 4

Figure 3A:
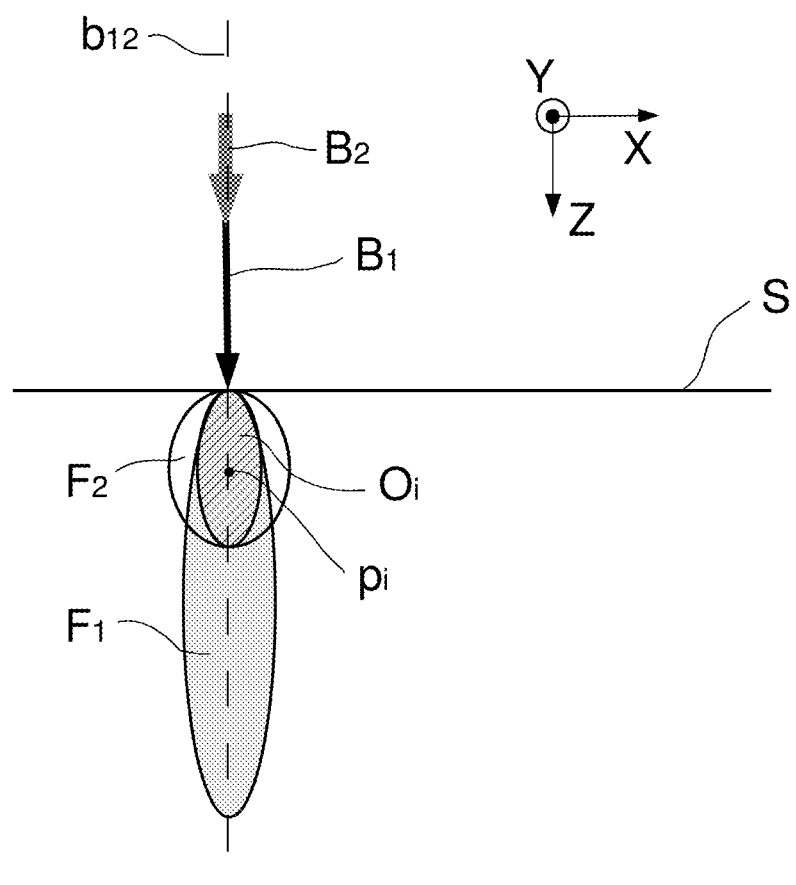

FIG. 3A renders a cross-sectional view of a specimen that is being imaged according to yet another embodiment of the current invention. As already alluded to above, this Figure schematically depicts the following:

A first the incoming radiation beam $B_1$, which comprises a first species of particle. When this beam $B_1$ impinges on S, it produces a PSF $F_1$ that extends to a relatively deep level into the specimen, but with relatively little lateral spread. This PSF $F_1$ intersects point $p_i$.

A second incoming radiation beam $B_2$, which comprises a second species of particle. When this beam $B_2$ impinges on S, it produces a PSF $F_2$ that extends to a relatively shallow level into the specimen, but with greater lateral spread than in the case of beam $B_1$. This PSF $F_2$ also intersects point $p_i$.

Since PSFs $F_2$ and $F_1$ differ in size and/or shape, point $p_i$ will experience different regions/portions/aspects of each. This fact allows (for example) ICA to be used in performing detector signal deconvolution within zone $O_i$, resulting in augmented spatial resolution in this zone.

The reconstruction mathematics in this case are broadly similar to the general framework set forth in Embodiments 1 and 2 above. This particular situation is one in which the relative weighting factor $\alpha$ introduced above in equations (3) and (18) can play an important role, because of the (typical) dissimilarity between PSFs $F_1$ and $F_2$.

Figure 3B:
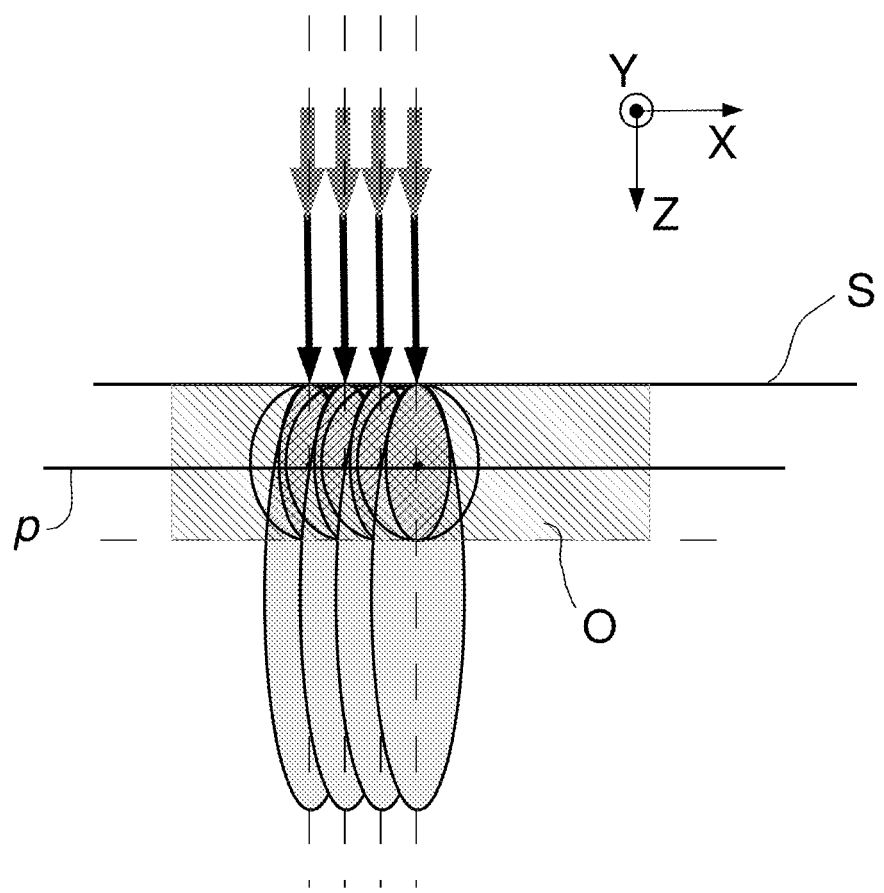

FIG. 3B has already been discussed in the general Description above, and requires no further elucidation here.

EMBODIMENT 5

Figure 4:
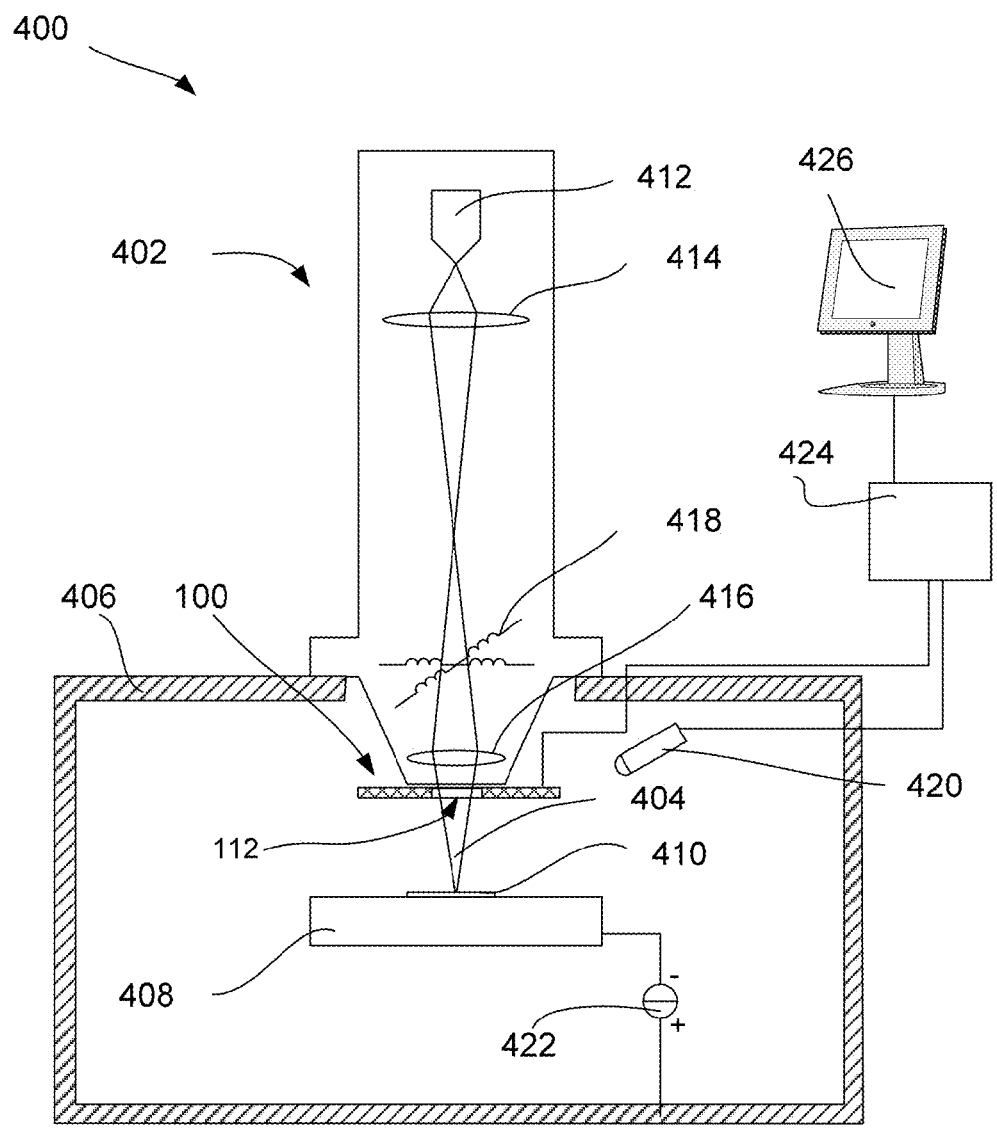

FIG. 4 is a highly schematic depiction of an embodiment of a scanning-type microscope according to the present invention; more specifically, it shows an embodiment of a charged-particle microscope 400, which, in this case, is a SEM. The microscope 400 comprises a particle-optical column 402, which produces a beam 404 of input charged particles (in this case, an electron beam). The particle-optical column 402 is mounted on a vacuum chamber 406, which comprises a specimen holder/stage 408 for holding a specimen 410. The vacuum chamber 406 is evacuated using vacuum pumps (not depicted). With the aid of voltage source 422, the specimen holder 408, or at least the specimen 410, may, if desired, be biased (floated) to an electrical potential with respect to ground.

The particle-optical column 402 comprises an electron source 412 (such as a Schottky gun), lenses 414, 416 to focus the electron beam 404 onto the specimen 410, and a deflection unit 418 (to perform beam steering/scanning of the beam 404). The apparatus 400 further comprises a controller/computer processing apparatus 424 for controlling inter alia the deflection unit 418, lenses 414, 416 and detectors 100, 420, and displaying information gathered from the detectors 100, 420 on a display unit 426. In the current context, items 414, 416 and 418 may be regarded as comprising the illuminator referred to above.

The detectors 420, 100 are chosen from a variety of possible detector types that can be used to examine different types of output radiation flux emanating from the specimen 410 in response to irradiation by the input beam 404. In the apparatus depicted here, the following detector choices have been made:

Detector 100 is a segmented electron detector. Such a detector can, for example, be used to investigate the angular dependence of a flux of output (secondary or backscattered) electrons emerging from the specimen 410.

Detector 420 is a boron-doped solid state detector that is used to detect (at least a portion of) a flux of output electrons emanating from the specimen 410.

As here rendered, both detectors 100 and 420 are used to examine electrons; however, this is purely a design/implementation choice and, if desired, one could also elect to detect other types of output radiation flux emanating from the specimen 410 (e.g. X-rays, cathodoluminescence) in addition, or as an alternative, to electrons.

By scanning the input beam 404 over the specimen 410, output radiation—comprising, for example, a flux of X-rays, infrared/visible/ultraviolet light, secondary electrons and or backscattered (BS) electrons—emanates from the specimen 410. As such output radiation is position-sensitive (due to said scanning motion), the information obtained from the detectors 100, 420, will also be position-dependent. This fact allows the output of detector 420 to be used to produce (for example) a BS electron image of (part of) the specimen 410, which image is basically a map of an output of detector 420 as a function of scan-path position on the specimen 410.

The signals from the detectors 100, 420 are processed by the controller 424, and displayed on display unit 426. Such processing may include operations such as combining, integrating, subtracting, false colouring, edge enhancing, and other processing known to the skilled artisan. In addition, automated recognition processes (e.g. as used for particle analysis) may be included in such processing.

It should be noted that many refinements and alternatives of such a set-up will be known to the skilled artisan, including, but not limited to:
- The use of dual beams—for example an electron beam 404 for imaging and an ion beam for machining (or, in some cases, imaging) the specimen 410;
- The use of a controlled environment at the specimen 410—for example, maintaining a pressure of several mbar (as used in a so-called Environmental SEM) or by admitting gases, such as etching or precursor gases, etc.

In the specific context of the current invention, the controller 424—and/or a dedicated separate processing unit (not shown)—can be invoked to perform the following actions in respect of a given point $p_i$ within the specimen 410:
- In a first probing session, employing a first beam configuration $B_1$ to irradiate the point $p_i$ with an associated first Point Spread Function $F_1$, whereby said beam configuration is different to said measurement parameter;
- In at least a second probing session, employing a second beam configuration $B_2$ to irradiate the point $p_i$ with an associated second Point Spread Function $F_2$, whereby: $F_2$ overlaps partially with $F_1$ in a common overlap zone $O_i$ in which point $p_i$ is located; $F_1$ and $F_2$ have respective non-overlapping zones $F_1'$ and $F_2'$ outside of $O_i$,
- Using a Source Separation algorithm in said computer processing apparatus to perform image reconstruction in said overlap zone $O_i$ considered separately from said non-overlapping zones $F_1'$ and $F_2'$.

Although the scanning-type microscope shown in FIG. 4 is a SEM, it could, in the context of the current invention, just as validly be a STEM, FIB-SEM or confocal microscope, for example.

EMBODIMENT 6

FIG. 5 depicts an experimental set-up and imagery pertaining to an exemplary embodiment of the current invention, as will now be explained in more detail.

Figure 5A:
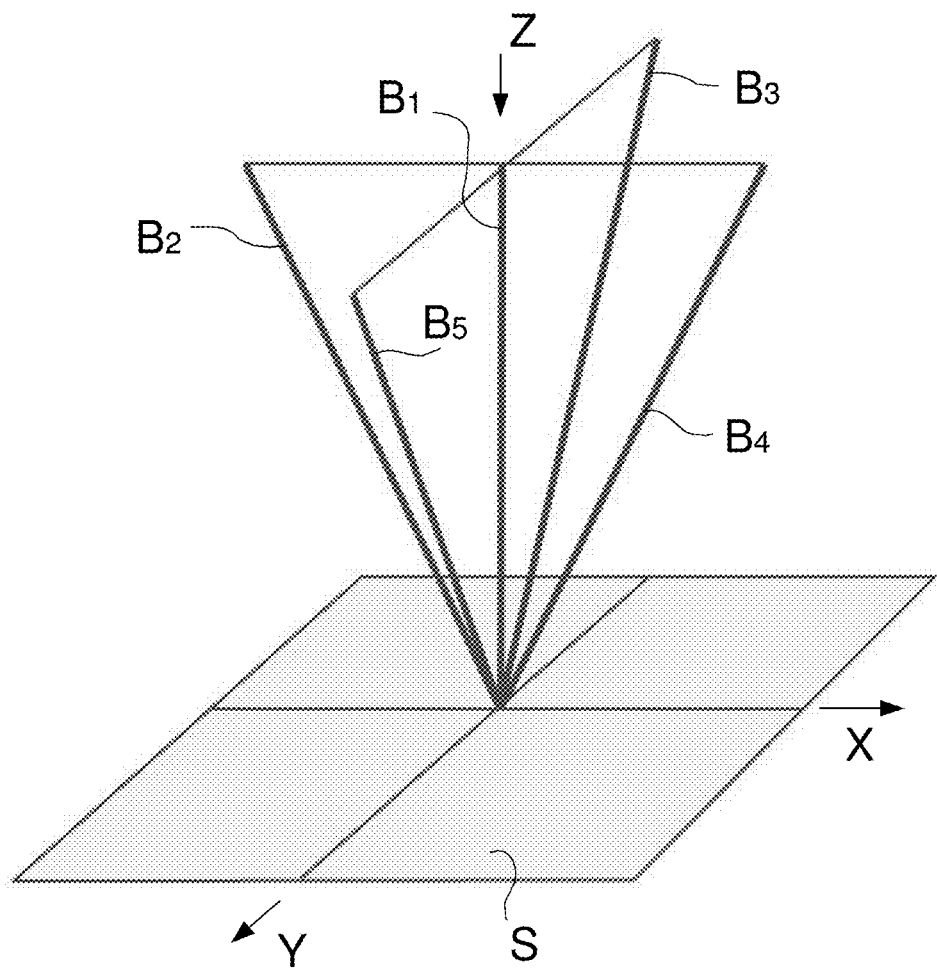
FIG. 5A depicts an experimental set-up pertaining to an exemplary embodiment of the current invention.

FIG. 5A shows a beam geometry used to irradiate a surface S of a specimen. This figure depicts five different incident beam configurations, as follows [whereby notation "(A, T)" indicates "(azimuth angle, tilt angle)", as respectively measured clockwise from X (viewed parallel to Z) and w.r.t. XY plane]:
- Beam $B_1$: normal incidence.
- Beam $B_2$: angled incidence at (A, T)=(180°, 60°).
- Beam $B_3$: angled incidence at (A, T)=(270°, 60°).
- Beam $B_4$: angled incidence at (A, T)=(0°, 60°).
- Beam $B_5$: angled incidence at (A, T)=(90°, 60°).

Figure 5B:
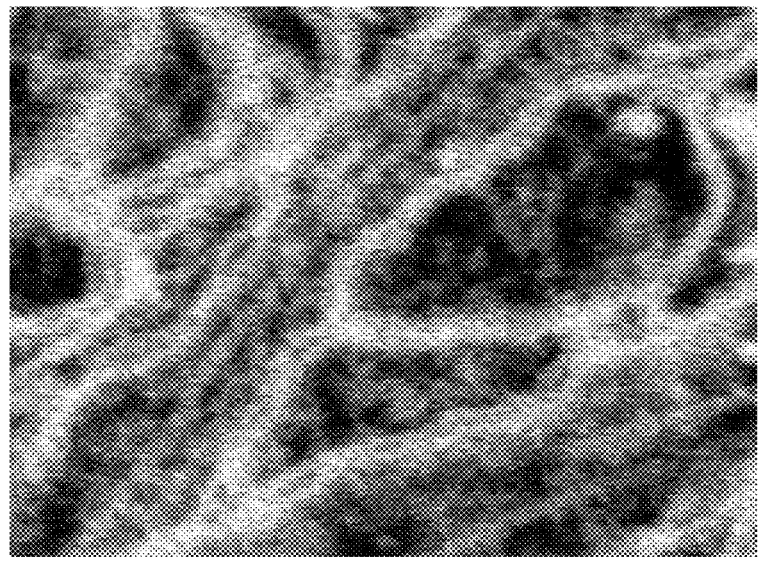
FIG. 5B shows imagery acquired by considering only beam $B_1$ of FIG. 5A
Figure 5C:
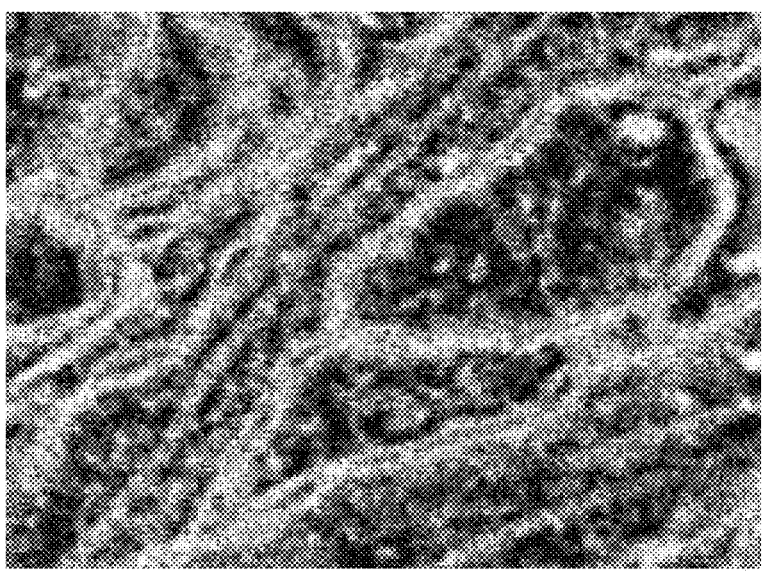
FIG. 5C shows imagery acquired using the exemplary embodiment of the current invention.

FIGS. 5B and 5C show SEM imagery of a specimen of mouse brain tissue, imaged with the following tool settings and in accordance with the set-up shown in FIG. 5A:
- Acceleration voltage: 2 kV.
- Beam current: ca. 400 pA.
- Depicted Field of View: 1.5 μm×1.1 μm.
- Resolution: 4 nm/pixel.
- Detected flux species: Backscattered electrons.

FIG. 5B shows the image obtained by considering beam $B_1$ only.

FIG. 5C shows the image obtained by combining all five beams and performing ICA-based image reconstruction in accordance with the present invention (see Embodiment 1 above, for example).

It is immediately clear that the detail/resolution in FIG. 5C (current invention) is very superior to that of FIG. 5B (prior art).

EMBODIMENT 7

FIG. 6 depicts imagery pertaining to another exemplary embodiment of the current invention. The specimen in this case comprises rabbit lung tissue, imaged with the following tool settings:
- Acceleration voltage: 2 kV.
- Beam current: ca. 400 pA.
- Depicted Field of View: 1.05 μm×0.98 μm.
- Resolution: 4 nm/pixel.
- Detected flux species: Backscattered electrons.

Figure 6A:
FIG. 6A shows a conventional FIB-SEM image of the specimen, using a prior-art imaging technique.

FIG. 6A shows a conventional FIB-SEM image of the specimen, using a prior-art imaging technique.

Figure 6B:
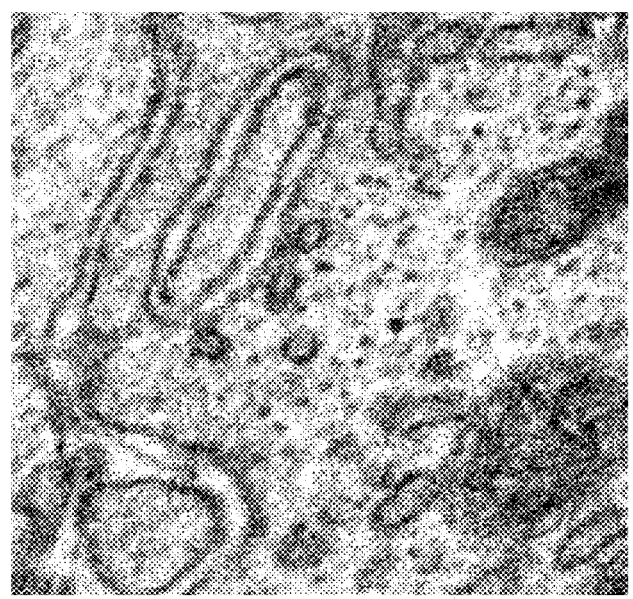
FIG. 6B depicts imagery pertaining to another exemplary embodiment of the current invention.

FIG. 6B shows the image obtained by performing ICA-based image reconstruction in accordance with the present invention, using an "irradiate-slice-irradiate" approach such as that set forth in Embodiment 2/FIG. 1A above, for example (the FIB functionality of the employed tool being used to perform ion milling on the specimen between irradiation runs, removing a layer of thickness L=ca. 4 nm).

It is again clear that that the image in FIG. 6B (current invention) is crisper than that of FIG. 6A (prior art).

The invention claimed is:

1. A method of accumulating an image of a specimen using a scanning-type microscope, comprising the following steps:
   - directing a beam of radiation from a source through an illuminator so as to irradiate a surface S of the specimen;
   - using a detector to detect a flux of radiation emanating from the specimen in response to said irradiation;
   - causing said beam to follow a scan path relative to said surface;
   - for each of a set of sample points in said scan path, recording an output Dn of the detector as a function of a value Pn of a selected measurement parameter P, thus compiling a measurement set M={(Dn, Pn)}, where n is a member of an integer sequence;

using computer processing apparatus to automatically deconvolve the measurement set M and spatially resolve it into a result set R representing depth-resolved imagery of the specimen, wherein, considered at a given point pi within the specimen, the method comprises the following steps:

in a first probing session, employing a first beam configuration B1 to irradiate the point pi with an associated first Point Spread Function F1, whereby said beam configuration is different to said measurement parameter;

in at least a second probing session, employing a second beam configuration B2 to irradiate the point pi with an associated second Point Spread Function F2, whereby F2 overlaps partially with F1 in a common overlap zone Oi in which point pi is located;

using an Independent Component Analysis algorithm in said computer processing apparatus to perform spatial resolution in said overlap zone Oi.

2. The method according to claim 1, wherein said surface is defined to extend parallel to an XY-plane of a Cartesian coordinate system XYZ;

said beam configuration is chosen to be a Z-position of a point of entry of the beam into the specimen;

between said first and second probing sessions, a physical slicing procedure is used to remove a layer of material of thickness L from an initial surface S1, thereby exposing a new surface S2;

point Spread Functions F2 and F1 are displaced relative to one another in said Z-direction by an amount L.

3. The method according to claim 1, wherein:

said beam configuration is chosen to be an angle of the beam relative to the surface S;

between said first and second probing sessions, said angle of the beam is adjusted;

point Spread Functions F2 and F1 are angled relative to one another.

4. The method according to claim 1, wherein:

said beam configuration is selected to be a species of particle in said beam;

point Spread Functions F2 and F1 are mutually different as regards to at least one of size and shape.

5. The method according to claim 1, wherein said measurement parameter is selected from the group comprising:

an average landing energy of particles in said beam;

an average current of charged particles in said beam;

an emission angle of particles in said flux;

an emission energy of particles in said flux, and combinations hereof.

6. The method according to claim 1, wherein said flux of radiation emanating from the specimen comprises at least one species selected from the group comprising backscatter electrons, secondary electrons, X-rays, infrared light, visible light, ultraviolet light, and combinations hereof.

7. The method according to claim 1, wherein said deconvolution and spatial resolution of the measurement set M are performed by minimizing a statistical divergence between a detection model and the measurement set M, assumed subject to at least one of Poisson noise and Gaussian noise, whilst applying constraints to said model.

8. A scanning-type microscope comprising:

a specimen holder, for holding a specimen;

a source, for producing a beam of radiation;

an illuminator, for directing said beam so as to irradiate said specimen;

a detector, for detecting a flux of radiation emanating from the specimen in response to said irradiation;

scanning means, for causing said beam to traverse a scan path relative to a surface of the specimen;

a controller, for:

recording an output Dn of the detector as a function of a value Pn of a selected measurement parameter P, for each of a set of sample points in said scan path, thus compiling a measurement set $M=\{(D_n, P_n)\}$, where n is a member of an integer sequence;

automatically deconvolving the measurement set M and spatially resolving it into a result set R representing depth-resolved imagery of the specimen, wherein, in respect of a given point pi within the specimen, said controller can be invoked to execute the following steps:

in a first probing session, employ a first beam configuration B1 to irradiate the point pi with an associated first Point Spread Function F1, whereby said beam configuration is different to said measurement parameter;

in at least a second probing session, employ a second beam configuration B2 to irradiate the point pi with an associated second Point Spread Function F2, whereby F2 overlaps partially with F1 in a common overlap zone Oi in which point pi is located;

use an Independent Component Analysis algorithm to perform spatial resolution in said overlap zone Oi.

9. The scanning-type microscope according to claim 8, wherein said beam configuration is chosen to be a Z-position of a point of entry of the beam into the specimen;

between said first and second probing sessions, a physical slicing procedure is used to remove a layer of material of thickness L from an initial surface S1, thereby exposing a new surface S2;

point Spread Functions F2 and F1 are displaced relative to one another in said Z-direction by an amount L.

10. The scanning-type microscope according to claim 8, wherein:

said beam configuration is chosen to be an angle of the beam relative to a surface S of the specimen;

between said first and second probing sessions, said angle of the beam is adjusted;

point Spread Functions F2 and F1 are angled relative to one another.

11. The scanning-type microscope according to claim 8, wherein:

said beam configuration is selected to be a species of particle in said beam;

point Spread Functions F2 and F1 are mutually different as regards to at least one of size and shape.

12. The scanning-type microscope according to claim 8, wherein said measurement parameter is selected from the group comprising:

an average landing energy of particles in said beam;

an average current of charged particles in said beam;

an emission angle of particles in said flux;

an emission energy of particles in said flux, and combinations hereof.

13. The scanning-type microscope according to claim 8, wherein said flux of radiation emanating from the specimen comprises at least one species selected from the group comprising backscatter electrons, secondary electrons, X-rays, infrared light, visible light, ultraviolet light, and combinations hereof.

14. The scanning-type microscope according to claim 8, wherein said deconvolution and spatial resolution of the measurement set M are performed by minimizing a statistical divergence between a detection model and the measurement set M, assumed subject to at least one of Poisson noise and Gaussian noise, whilst applying constraints to said model.

* * * * *